(12) United States Patent
Shimizu et al.

(10) Patent No.: US 10,658,185 B2
(45) Date of Patent: May 19, 2020

(54) LASER IRRADIATION APPARATUS, METHOD FOR MANUFACTURING SEMICONDUCTOR DEVICE, AND METHOD FOR OPERATING LASER IRRADIATION APPARATUS

(71) Applicant: THE JAPAN STEEL WORKS, LTD., Shinagawa-ku, Tokyo (JP)

(72) Inventors: Ryo Shimizu, Yokohama (JP); Ryosuke Sato, Yokohama (JP); Teruaki Shimoji, Yokohama (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 0 days.

(21) Appl. No.: 16/330,759

(22) PCT Filed: Jun. 2, 2017

(86) PCT No.: PCT/JP2017/020638
§ 371 (c)(1),
(2) Date: Mar. 5, 2019

(87) PCT Pub. No.: WO2018/066172
PCT Pub. Date: Apr. 12, 2018

(65) Prior Publication Data
US 2019/0189449 A1    Jun. 20, 2019

(30) Foreign Application Priority Data
Oct. 4, 2016   (JP) ................................ 2016-196491

(51) Int. Cl.
*H01L 21/268*        (2006.01)
*H01L 21/677*        (2006.01)
(Continued)

(52) U.S. Cl.
CPC ........ *H01L 21/268* (2013.01); *B23K 26/0006* (2013.01); *B23K 26/0732* (2013.01);
(Continued)

(58) Field of Classification Search
None
See application file for complete search history.

(56) References Cited

U.S. PATENT DOCUMENTS 6,437,357 B1 * 8/2002 Weiss ................... G01N 21/896
250/223 R
2004/0240608 A1 * 12/2004 Schrock ................ G01N 23/00
378/57
(Continued)

FOREIGN PATENT DOCUMENTS

JP    2002-176008 A    6/2002
JP    2007-150245 A    6/2007
(Continued)

OTHER PUBLICATIONS

International Search Report from International Patent Application No. PCT/JP2017/020638, dated Aug. 29, 2017.

*Primary Examiner* — Angel Roman
(74) *Attorney, Agent, or Firm* — SGPatents PLLC

(57) ABSTRACT

A laser annealing apparatus (1) according to an embodiment includes a laser oscillator (4) configured to generate a laser beam (L), a floating-type conveying stage (3) configured to float and convey a workpiece (W) to be irradiated with the laser beam (L), and a beam profiler (7) configured to measure a beam profile of the laser beam (L). The floating-type conveying stage (3) includes a conveying surface (3*a*) opposed to the workpiece (W), and a bottom surface (3*b*) on the side opposite to the conveying surface (3*a*). The beam profiler (7) is positioned below the bottom surface (3*b*) of the floating-type conveying stage (3). The floating-type conveying stage (3) includes a detachable part (12) in a part of it. An opening (S) is formed by detaching the detachable part (12) from the floating-type conveying stage (3), the opening (3) extending from the conveying surface (3*a*) to the bottom surface (3*b*). The beam profiler (7) is configured
(Continued)

to measure the beam profile of the laser beam (L) through the opening (S).

19 Claims, 13 Drawing Sheets

(51) Int. Cl.
    *B23K 26/073*     (2006.01)
    *G01J 1/42*     (2006.01)
    *H01L 21/02*     (2006.01)
    *H01L 29/786*     (2006.01)
    *B23K 26/00*     (2014.01)
    *B23K 26/70*     (2014.01)
    *B23K 26/352*     (2014.01)
    *G09F 9/00*     (2006.01)
    *B23K 26/12*     (2014.01)
    *H01L 21/67*     (2006.01)
    *B23K 26/08*     (2014.01)
    *B23K 103/00*     (2006.01)
    *B23K 101/40*     (2006.01)

(52) U.S. Cl.
    CPC ........ *B23K 26/0838* (2013.01); *B23K 26/127* (2013.01); *B23K 26/352* (2015.10); *B23K 26/705* (2015.10); *B23K 26/707* (2015.10); *G01J 1/4257* (2013.01); *G09F 9/00* (2013.01); *H01L 21/02678* (2013.01); *H01L 21/677* (2013.01); *H01L 21/6776* (2013.01); *H01L 21/67115* (2013.01); *H01L 21/67784* (2013.01); *H01L 29/786* (2013.01); *B23K 2101/40* (2018.08); *B23K 2103/56* (2018.08); *H01L 21/02381* (2013.01); *H01L 21/02422* (2013.01); *H01L 21/02532* (2013.01); *H01L 21/02675* (2013.01)

(56) References Cited

U.S. PATENT DOCUMENTS

| | | | |
|---|---|---|---|
| 2007/0030953 A1* | 2/2007 | Sommer, Jr. | G01N 23/06 378/53 |
| 2009/0111244 A1 | 4/2009 | Yamazaki et al. | |
| 2009/0115028 A1 | 5/2009 | Shimomura et al. | |
| 2016/0279736 A9* | 9/2016 | Kajiyama | H01L 21/02422 |
| 2018/0038679 A1* | 2/2018 | Paske | G01B 11/02 |
| 2018/0315633 A1* | 11/2018 | Shimizu | H01L 21/268 |

FOREIGN PATENT DOCUMENTS

| | | |
|---|---|---|
| JP | 2009-135430 A | 6/2009 |
| JP | 2009-135437 A | 6/2009 |
| WO | WO 2015/174347 A1 | 11/2015 |

\* cited by examiner

LASER IRRADIATION APPARATUS, METHOD FOR MANUFACTURING SEMICONDUCTOR DEVICE, AND METHOD FOR OPERATING LASER IRRADIATION APPARATUS

TECHNICAL FIELD

The present invention relates to a laser irradiation apparatus, a method for manufacturing a semiconductor device, and a method for operating the laser irradiation apparatus. For example, the present invention relates to measurement of a beam profile of a laser beam.

BACKGROUND ART

Patent Literature 1 discloses a laser annealing apparatus that conveys an object to be processed in a floated state and applies a laser beam to the object to be processed.

CITATION LIST

Patent Literature

Patent Literature 1: International Patent Publication No. WO2015/174347

SUMMARY OF INVENTION

Technical Problem

However, Patent Literature 1 does not mention measurement of a beam profile of a laser beam at all.

Other problems to be solved and novel features will become apparent from descriptions in this specification and accompanying drawings.

Solution to Problem

In order to solve the above-described problem, a laser irradiation apparatus is configured so that a part of a conveying stage can be removed.

Advantageous Effects of Invention

By the above-described configuration, it is possible to measure a beam profile of a laser beam through an opening that is formed by removing the part of the conveying stage.

DESCRIPTION OF EMBODIMENTS

Comparative Example 1

Figure 15:
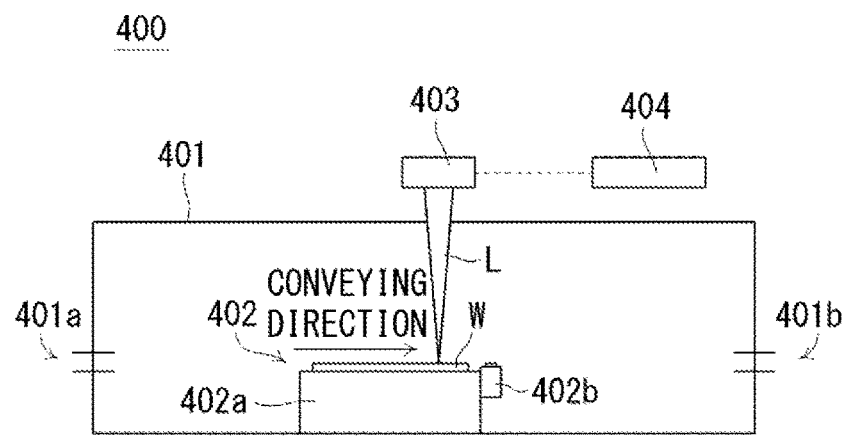
FIG. 15 is a side cross section for explaining a laser annealing apparatus according to a Comparative Example 1.
Figure 15:
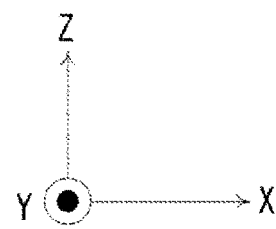

Firstly, a laser annealing apparatus 400 according to a Comparative Example 1 is described with reference to FIG. 15. The laser annealing apparatus 400 is an apparatus that forms, for example, a polysilicon film by applying a laser beam to an amorphous silicon film provided over a silicon substrate or a glass substrate. The laser annealing apparatus 400 includes a processing chamber 401, a movable conveying stage unit 402, an optical system 403, and a laser oscillator 404.

In the processing chamber 401, a carrying-in port 401a for carrying a workpiece W, which is an object to be processed, into the processing chamber 401 and a carrying-out port 401b for carrying out an annealed workpiece W from the processing chamber 401 are provided.

The mobile conveying stage unit 402 is configured so that it can be moved from the carrying-in port 401a toward the carrying-out port 401b in the +X direction in the processing chamber 401. The movable conveying stage unit 402 includes a stage main body 402a for supporting a workpiece W and a beam profiler 402b. The beam profiler 402b is fixed to the stage main body 402a and is movable in the +X direction together with the stage main body 402a in the processing chamber 401.

The optical system 403 is formed by using a mirror or a lens. The optical system 403 concentrates and shapes a laser beam L generated by the laser oscillator 404 into a predetermined shape, and directs the shaped laser beam L into the processing chamber 401.

Then, a workpiece W is annealed by applying the laser beam L to the workpiece W while moving the movable conveying stage unit 402 from the carrying-in port 401a toward the carrying-out port 401b in the +X direction.

At this point, it is possible to measure a beam profile of the laser beam L by using the beam profiler 402b disposed in the movable conveying stage unit 402. The beam profiler 402b is fixed to, for example, a side of the stage main body 402a.

Although the above-described laser annealing apparatus 400 according to the Comparative Example 1 is superior because it can measure the beam profile of the laser beam L without problems, there are still some problems to be solved. That is, firstly, it takes wasteful time when a workpiece W placed on the stage main body 402a is replaced. Secondly, when a workpiece W is peeled from the stage main body 402a, the workpiece W may be electrostatically charged due to the peeling. Thirdly, when a workpiece W is supported on the stage main body 402a, the workpiece W may be contaminated due to the contact with the stage main body 402a. Fourthly, a cycle time tends to increase to alleviate the aforementioned second and third problems, thus raising a possibility that productivity may deteriorate.

Comparative Example 2

Figure 16:
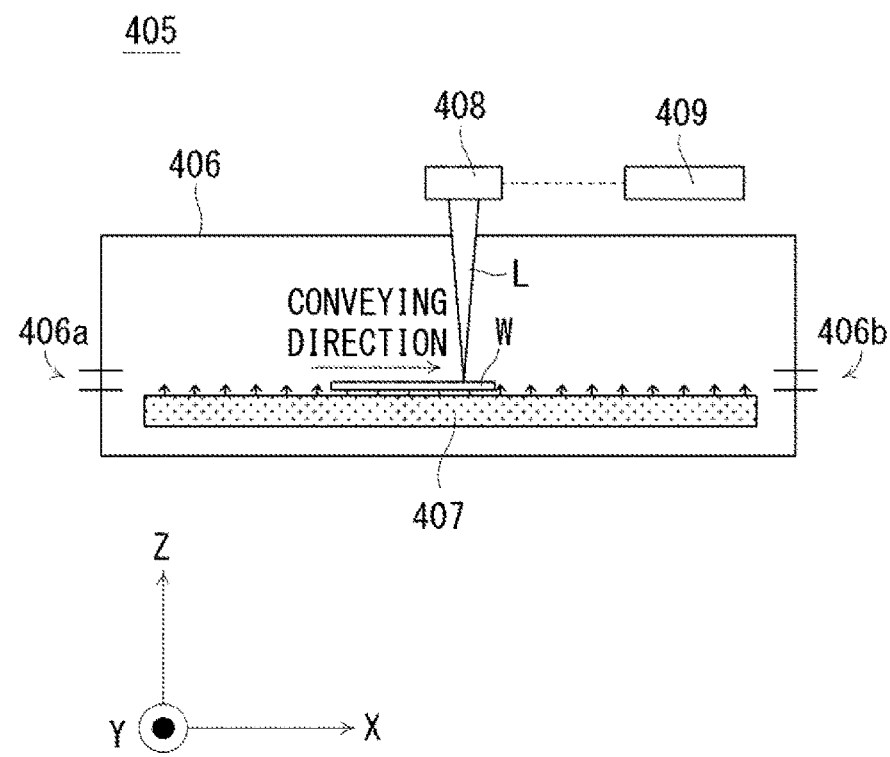
FIG. 16 is a side cross section for explaining a laser annealing apparatus according to a Comparative Example 2.

Next, a laser annealing apparatus 405 according to a Comparative Example 2 is described with reference to FIG. 16. The laser annealing apparatus 405 is an apparatus that forms, for example, a polysilicon film by applying a laser beam to an amorphous silicon film provided over a silicon substrate or a glass substrate. The laser annealing apparatus 405 includes a processing chamber 406, a floating-type conveying stage 407, an optical system 408, a laser oscillator 409, and a workpiece conveying unit (not shown).

In the processing chamber 406, a carrying-in port 406a for carrying a workpiece W, which is an object to be processed, into the processing chamber 406 and a carrying-out port 406b for carrying out an annealed workpiece W from the processing chamber 406 are provided.

The floating-type conveying stage 407 is immovably disposed in the processing chamber 406 and is configured so that it can float and convey a workpiece W.

The optical system 408 is formed by using a mirror or a lens. The optical system 408 concentrates and shapes a laser beam L generated by the laser oscillator 409 into a predetermined shape, and directs the shaped laser beam L into the processing chamber 406.

Then, a workpiece W is annealed by applying the laser beam L to the workpiece W while floating the workpiece W over the floating-type conveying stage 407 and moving it from the carrying-in port 406a toward the carrying-out port 406b in the +X direction by the above-described workpiece conveying unit.

The Comparative Example 2 solves three problems in the above-described Comparative Example 1 because the workpiece W is moved in the +X direction in the processing chamber 406 while being floated over the floating-type conveying stage 407.

However, it is impossible to dispose the beam profiler in a position suitable for measuring the beam profile of the laser beam L in the configuration of the Comparative Example 2.

First Embodiment

A laser annealing apparatus to which a laser irradiation apparatus according to a first embodiment is applied is described hereinafter with reference to FIGS. 1 to 3. Note that the laser irradiation apparatus according to the first embodiment may be applied to a laser peeling apparatus as well as to the laser annealing apparatus.
(Configuration of Laser Irradiation Apparatus)

Figure 1:
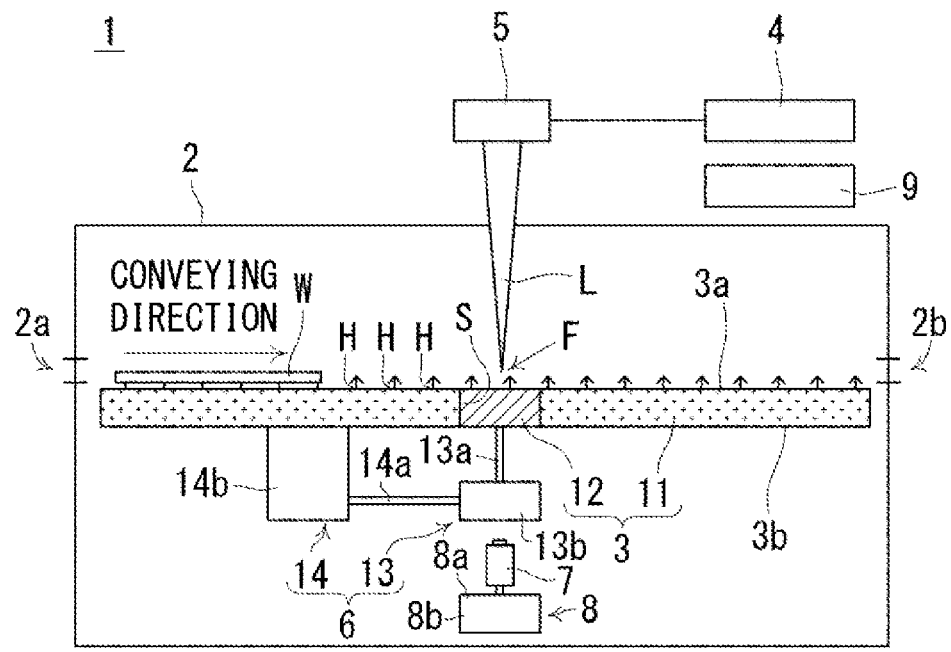
FIG. 1 is a side cross section for explaining a laser annealing apparatus according to a first embodiment.
Figure 1:
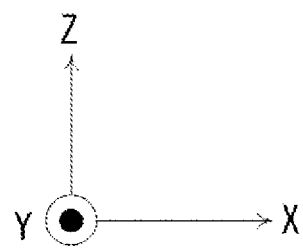
Figure 2:
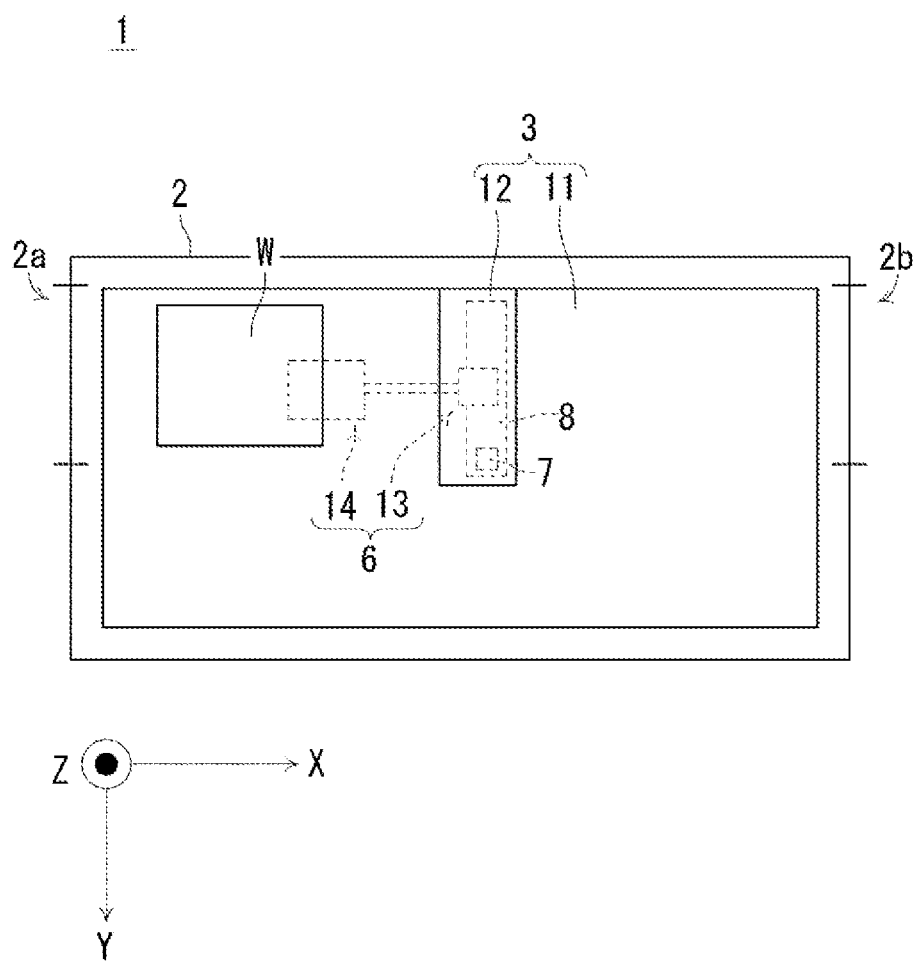
FIG. 2 is a plan view for explaining the laser annealing apparatus according to the first embodiment.

As shown in FIGS. 1 and 2, a laser annealing apparatus 1 according to the first embodiment may be, for example, an apparatus for forming a polysilicon film by applying a laser beam to an amorphous silicon film provided over a silicon substrate or a glass substrate and thereby crystallizing the amorphous silicon film. The laser annealing apparatus 1 includes a processing chamber 2, a floating-type conveying stage 3 as a conveying stage, a laser oscillator 4, an optical system 5, an attaching/detaching actuator 6, a beam profiler 7 as a measuring instrument, a profiler actuator 8, and a control unit 9. Note that in FIG. 2, illustration of the laser oscillator 4, the optical system 5, and the control unit 9 is omitted for convenience of explanation.

As shown in FIG. 1, in the processing chamber 2, a carrying-in port 2a for carrying a workpiece W, which is an object to be processed, into the processing chamber 2 and a carrying-out port 2b for carrying out an annealed workpiece W from the processing chamber 2 are provided. In the first embodiment, the carrying-in port 2a and the carrying-out port 2b are disposed on a pair of side walls opposed to each other. A workpiece W is carried into the processing chamber 2 through the carrying-in port 2a, annealed in the processing chamber 2, and carried out from the processing chamber 2 through the carrying-out port 2b. Note that for convenience of explanation, a direction from the carrying-in port 2a toward the carrying-out port 2b is defined as a conveying direction (+X direction) in the first embodiment. Further, a vertically upward direction is defined as a +Z direction and a direction orthogonal to the X and Z directions is defined as a Y direction.

The floating-type conveying stage 3 is a conveying stage for floating and conveying a workpiece W to be irradiated with a laser beam L. Specifically, the workpiece W is floated by gas ejected from the floating-type conveying stage 3 toward the workpiece W. The floating-type conveying stage 3 has a conveying surface 3a, which is opposed to the workpiece W, and a bottom surface 3b on the side opposite to the conveying surface 3a. A plurality of ejecting holes H through which gas is ejected upward are formed on the conveying surface 3a.

Further, the floating-type conveying stage 3 includes a conveying stage main body 11 with an opening S opened in the vertical direction (Z direction), and a detachable part 12 that can be attached in and detached from the opening S of the conveying stage main body 11. That is, the floating-type conveying stage 3 includes, in a part thereof, the detachable part 12 that can be detached therefrom. Further, the opening S that extends from the conveying surface 3a to the bottom surface 3b is formed in the floating-type conveying stage 3 by detaching the detachable part 12 from the floating-type conveying stage 3. The opening S and the detachable part 12 are located on an optical axis of the laser beam L. That is, the detachable part 12 is a part of the floating-type conveying stage 3 to which the laser beam L is applied.

The laser oscillator 4 generates the laser beam L. In the first embodiment, the laser beam L generated by the laser oscillator 4 is not limited to any particular type. Examples of the laser beam L include an excimer laser beam.

The optical system 5 is formed by using a mirror or a lens. As shown in FIG. 3, the optical system 5 concentrates and shapes the laser beam L generated by the laser oscillator 4 into a predetermined shape, and directs the shaped laser beam L into the processing chamber 2. In the first embodiment, the predetermined shape of the laser beam L at a focal point F of the laser beam L is a rectangle. That is, a planar shape of the laser beam L is a rectangle extending in a direction orthogonal to the conveying direction, and has a long axis and a short axis.

Referring to FIG. 1 again, the attaching/detaching actuator 6 is an actuator for moving the detachable part 12. Specifically, the attaching/detaching actuator 6 is an actuator for attaching/detaching the detachable part 12 in/from the opening S of the conveying stage main body 11. The attaching/detaching actuator 6 is fixed to the conveying stage main body 11 of the floating-type conveying stage 3. The attaching/detaching actuator 6 includes a vertical actuator 13 for moving the detachable part 12 attached in the opening S of the conveying stage main body 11 in the vertical direction (Z direction) and a horizontal actuator 14 for moving the detachable part 12 in the horizontal direction (X direction) after the movement thereof by the vertical actuator 13. The vertical actuator 13 is an actuator including a shaft 13a connected to the detachable part 12 and a drive source 13b for moving the shaft 13a forward or backward in the vertical direction (Z direction). The horizontal actuator 14 is an actuator including a shaft 14a connected to the drive source 13b of the vertical actuator 13 and a drive source 14b for moving the shaft 14a forward or backward in the horizontal direction (X direction). The vertical actuator 13 and the horizontal actuator 14 are, for example, air cylinders.

The beam profiler 7 is a measuring instrument for measuring a beam profile of the laser beam L. In the first embodiment, the beam profiler 7 is positioned below the bottom surface 3b of the floating-type conveying stage 3. The beam profiler 7 is disposed directly below the detachable part 12 attached in the opening S of the conveying stage main body 11. The beam profiler 7 is positioned on the optical axis of the laser beam L.

The profiler actuator 8 is an actuator for moving the beam profiler 7. The profiler actuator 8 is fixed to the processing chamber 2. The profiler actuator 8 includes an inserting/removing actuator 8a and a scanning actuator 8b. The inserting/removing actuator 8a is an actuator for moving the beam profiler 7 in the vertical direction (Z direction). The inserting/removing actuator 8a is an actuator for inserting/removing the beam profiler 7 into/from the opening S of the conveying stage main body 11. The inserting/removing actuator 8a includes a shaft and a drive source for moving this shaft forward or backward. The inserting/removing actuator 8a is, for example, an air cylinder. By the inserting/removing actuator 8a, the beam profiler 7 can be moved from a position below the bottom surface 3b of the floating-type conveying stage 3 to a position of the opening S. In this way, the beam profiler 7 can measure the beam profile of the laser beam L at the focal point F thereof. The scanning actuator 8b is an actuator for moving the beam profiler 7 in a width direction (Y direction). Specifically, the scanning actuator 8b is an actuator for moving the beam profiler 7 along the long axis of the planar shape of the laser beam L shown in FIG. 3. Therefore, the beam profiler 7 can be moved along the long axis of the planar shape of the laser beam L.

The control unit 9 is a control unit for controlling operations of the attaching/detaching actuator 6 and the profiler actuator 8, and controlling an output of the laser oscillator 4. In particular, the control unit 9 controls attaching/detaching operations of the detachable part 12 to/from the conveying stage main body 11, up/down movements of the beam profiler 7, and so on. The control unit 9 includes a CPU (Central Processing Unit) as a central processing unit, a readable/writable RAM (Random Access Memory), and a read-only ROM (Read Only Memory). A control program(s) that can be loaded and executed by the CPU is stored in the ROM.

In addition, the laser annealing apparatus 1 includes a conveying unit (not shown) for holding and conveying the workpiece W floated over the floating-type conveying stage 3. Examples of the holding of the workpiece W by the conveying unit include holding by grasping, holding by adsorption, etc.

By the above-described configuration, when the beam profile of the laser beam L is measured by the beam profiler 7, the detachable part 12 is removed from the floating-type conveying stage 3. As a result, the opening S extending from the conveying surface 3a to the bottom surface 3b is formed in the floating-type conveying stage 3, so that the beam profiler 7 can measure the beam profile of the laser beam L through the opening S. Therefore, when the beam profile of the laser beam L is measured by using the beam profiler 7, the presence of the floating-type conveying stage 3 does not act as an obstacle. Meanwhile, when the workpiece W is conveyed over the floating-type conveying stage 3, it is only necessary to attach the detachable part 12 to the floating-type conveying stage 3.

(Operation of Laser Irradiation Apparatus)

Figure 4:
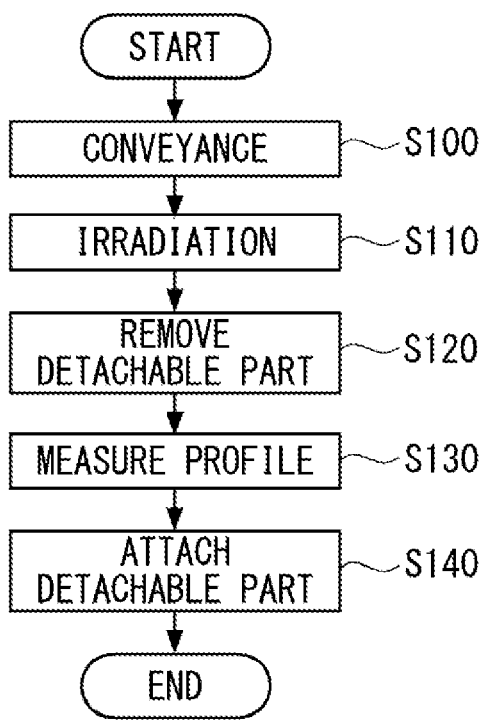
FIG. 4 is a flowchart showing a manufacturing method according to the first embodiment.

Next, a method for manufacturing a semiconductor device by using the laser annealing apparatus 1 is described in detail with reference to FIGS. 4 to 10. FIG. 4 shows a flowchart of a method for operating the laser annealing apparatus 1.

Figure 5:
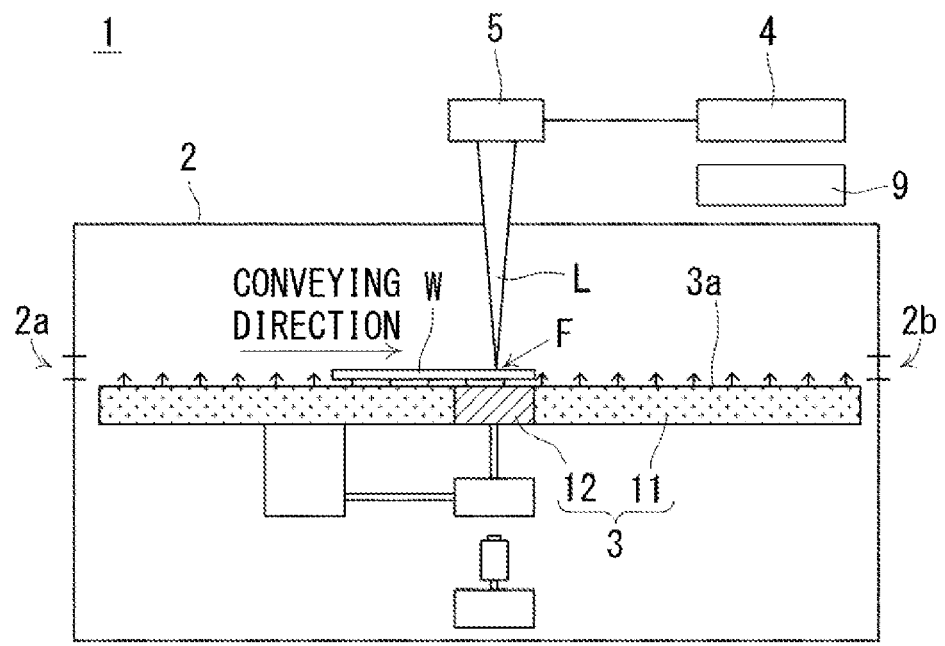
FIG. 5 is a side cross section for explaining the laser annealing apparatus according to the first embodiment.

Firstly, as shown in FIG. 5, the control unit 9 conveys a workpiece W, which has been carried into the processing chamber 2 through the carrying-in port 2a, in the +X direction while floating the workpiece W by controlling a workpiece conveying unit (not shown) (S100). That is, the control unit 9 conveys the workpiece W while floating the workpiece W over the floating-type conveying stage 3 by gas ejected from the floating-type conveying stage 3 toward the workpiece W. In the first embodiment, the workpiece W includes a glass substrate and an amorphous silicon film.

Then, the control unit 9 emits a laser beam L toward the amorphous silicon film of the workpiece W, which is being conveyed, by controlling the laser oscillator 4 and the optical system 5 (S110). As a result, the amorphous silicon film is crystallized and a polysilicon film is thereby formed. After that, the workpiece W is carried out from the carrying-out port 2b for the next process.

Figure 6:
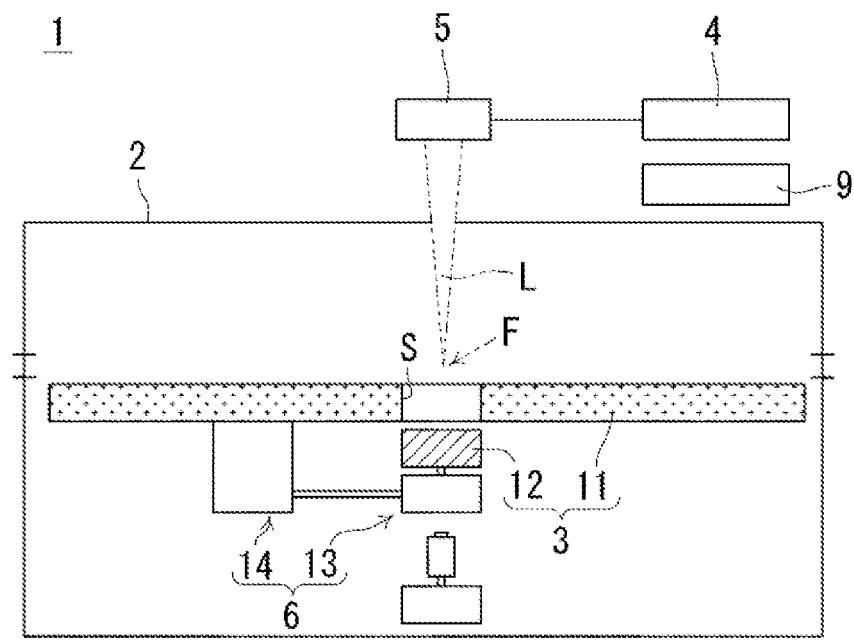
FIG. 6 is a side cross section for explaining the laser annealing apparatus according to the first embodiment.
Figure 6:
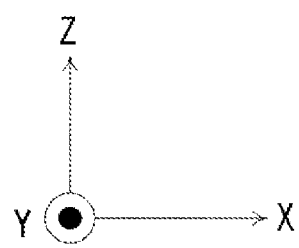

Next, as shown in FIG. 6, the control unit 9 detaches the detachable part 12 of the floating-type conveying stage 3 by controlling the vertical actuator 13 (S120). As a result, an opening S extending from the conveying surface 3a to the bottom surface 3b is formed in a part of the floating-type conveying stage 3.

Figure 7:
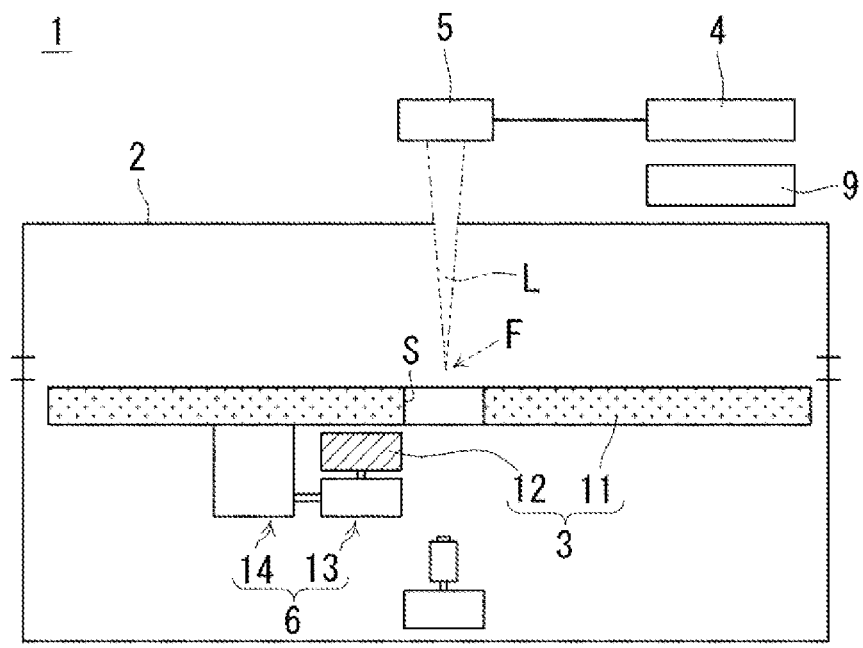
FIG. 7 is a side cross section for explaining the laser annealing apparatus according to the first embodiment.
Figure 7:
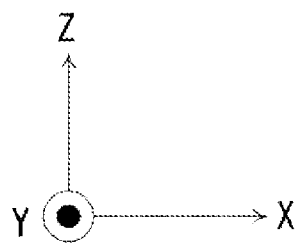

In the first embodiment, as shown in FIG. 7, the control unit 9 further controls the horizontal actuator 14 so that the detachable part 12 moves in the horizontal direction (−X direction).

Figure 8:
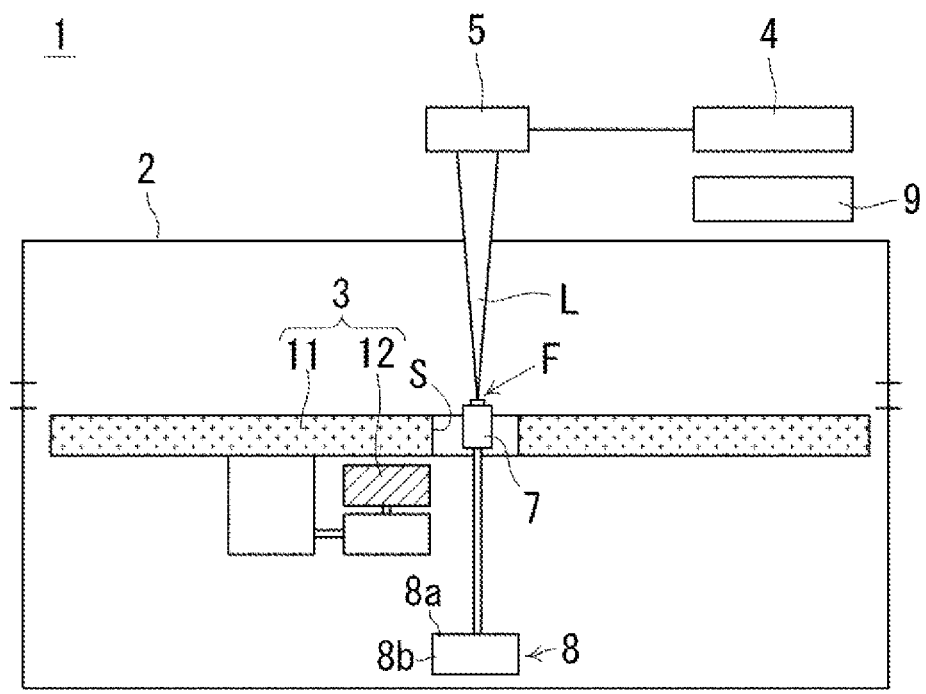
FIG. 8 is a side cross section for explaining the laser annealing apparatus according to the first embodiment.
Figure 8:
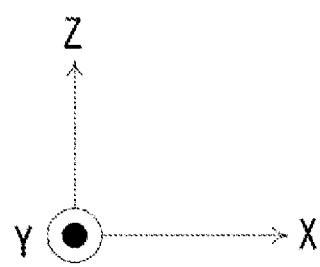

Next, as shown in FIG. 8, the control unit 9 moves the beam profiler 7 to the position of the opening S by controlling the inserting/removing actuator 8a. Then, the control unit 9 measures the beam profile of the laser beam L at the focal point F thereof through the opening S (step S130).

Figure 3:
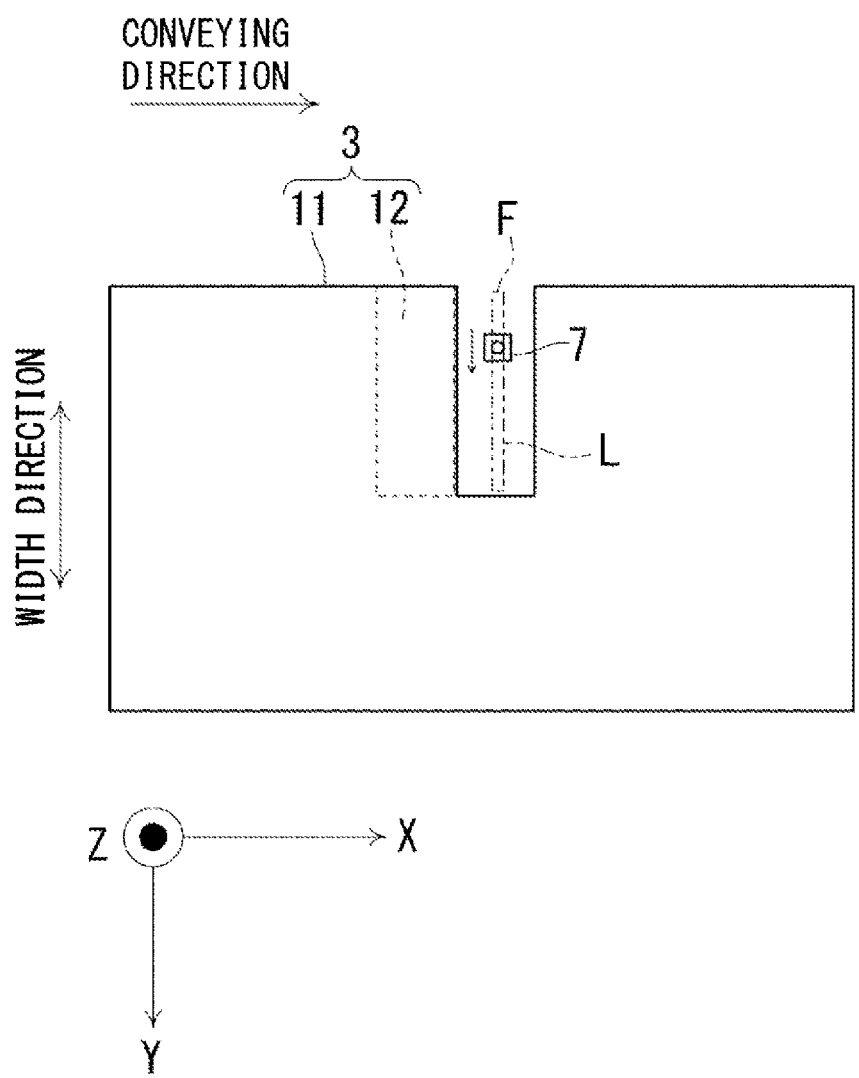
FIG. 3 is a plan view for explaining the laser annealing apparatus according to the first embodiment.
Figure 9:
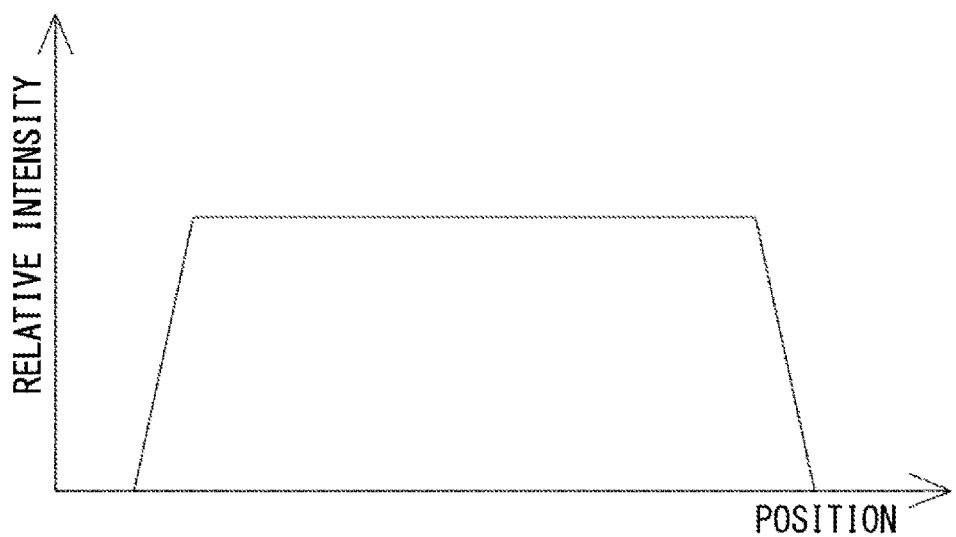
FIG. 9 is a graph showing an example of a measurement result of beam profiles of laser beams.

Note that, as shown in FIG. 3, the planar shape of the laser beam L is shaped into a rectangle extending in the width direction (Y direction) in the first embodiment. Therefore, the control unit 9 measures the beam profile of the laser beam L at the focal point F thereof while moving the beam profiler 7 in the width direction (Y direction) by controlling the scanning actuator 8b shown in FIG. 8. FIG. 9 shows an example of a measurement result by the beam profiler 7. FIG. 9 is a graph showing a beam profile at the focal point F of the laser beam L, in which a horizontal axis represents positions in the width direction (Y direction) and a vertical axis represents relative intensities. In the first embodiment, as the beam profile of the laser beam L at the focal point F thereof, attention is paid, for example, to the relative intensity of the laser beam L at the focal point F of the laser beam L. Further, when the beam profile of the laser beam L at the focal point F thereof is not a desired beam profile, the control unit 9 corrects the operation of the laser oscillator 4 and/or the optical system 5 so that the beam profile of the laser beam L at the focal point F thereof becomes the desired beam profile.

Figure 10:
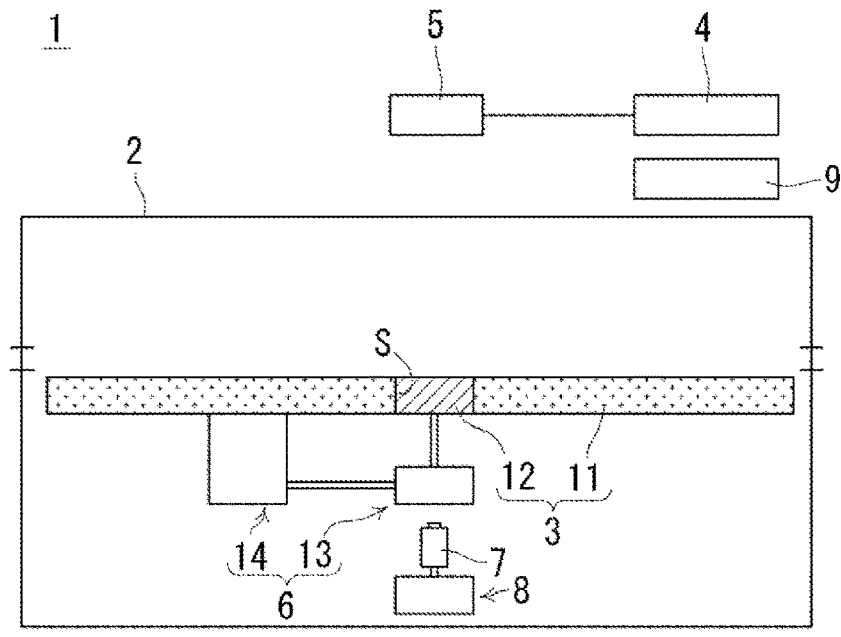
FIG. 10 is a side cross section for explaining the laser annealing apparatus according to the first embodiment.
Figure 10:
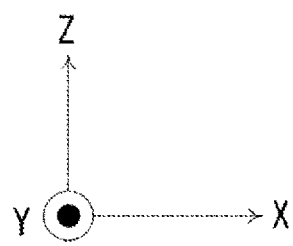

Next, as shown in FIG. 10, the control unit 9 removes the beam profiler 7 from the opening S by controlling the profiler actuator 8, and inserts and attaches the detachable part 12 in the opening S by controlling the attaching/detaching actuator 6 (S140).

According to the above-described method for manufacturing a semiconductor device (steps S100 to S140), it is possible to measure the beam profile of the laser beam L through the opening S formed by removing a part of the floating-type conveying stage 3.

The first embodiment has been described above. In the above-described first embodiment, the laser annealing apparatus 1, which serves as a laser irradiation apparatus, includes at least the laser oscillator 4, the floating-type conveying stage 3, and the beam profiler 7.

Second Embodiment

Figure 11:
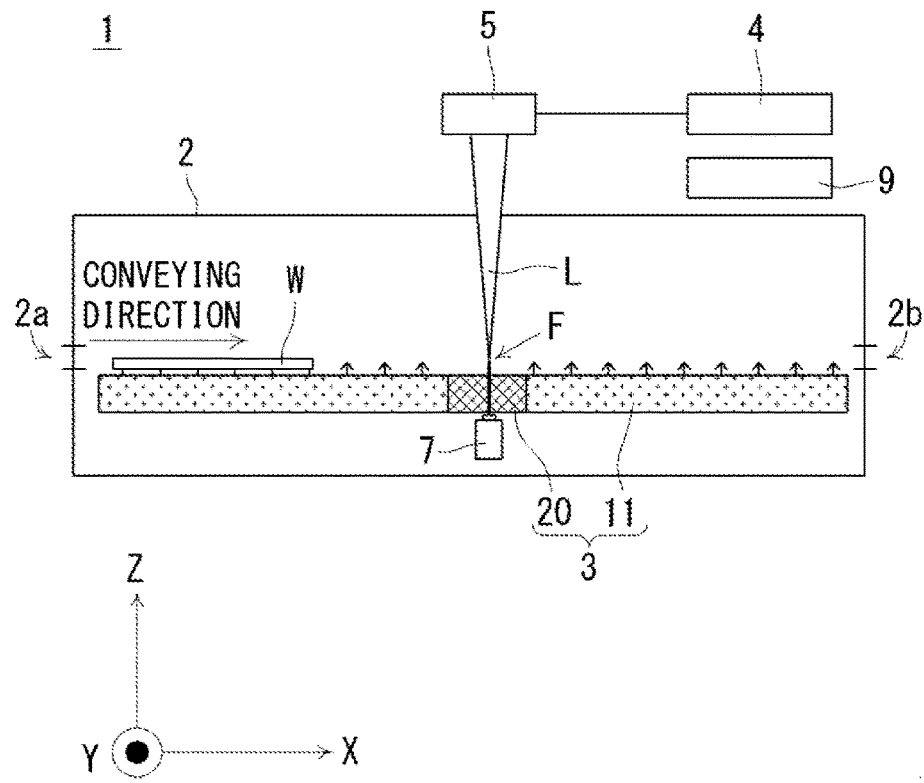
FIG. 11 is a side cross section for explaining a laser annealing apparatus according to a second embodiment.

A laser annealing apparatus to which a laser irradiation apparatus according to a second embodiment is applied is described hereinafter with reference to FIG. 11. In the following description, differences of the second embodiment from the above-described first embodiment are mainly explained and redundant descriptions are omitted.

In the above-described first embodiment, the detachable part 12 is configured so that it can be attached to and detached from the floating-type conveying stage 3. In contrast to this, in the second embodiment, a part of the floating-type conveying stage 3 that is positioned on the optical axis of the laser beam L is formed by a lens 20. The lens 20 is designed so that it projects the focal point of the laser beam L onto the beam profiler 7 disposed below the floating-type conveying stage 3. By the above-described configuration, it is possible to measure the beam profile of the laser beam L at the focal point F thereof by using the beam profiler 7 disposed below the floating-type conveying stage 3.

Third Embodiment

Figure 12:
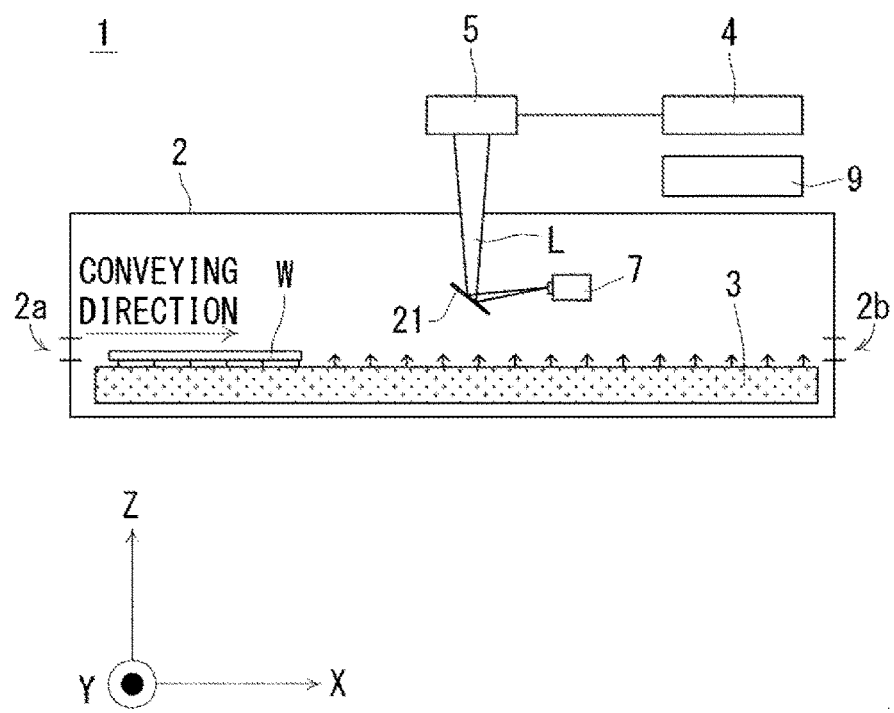
FIG. 12 is a side cross section for explaining a laser annealing apparatus according to a third embodiment.

A laser annealing apparatus to which a laser irradiation apparatus according to a third embodiment is applied is described hereinafter with reference to FIG. 12. In the following description, differences of the third embodiment from the above-described first embodiment are mainly explained and redundant descriptions are omitted.

In the above-described first embodiment, the detachable part 12 is configured so that it can be attached to and detached from the floating-type conveying stage 3. Further, the beam profiler 7 is disposed below the floating-type conveying stage 3.

In contrast, in the third embodiment, the beam profiler 7 is disposed above the floating-type conveying stage 3. Further, an optical element 21 that reflects or bends the optical axis of the laser beam L, such as a mirror, is disposed on the optical axis of the laser beam L, so that the laser beam L emitted from the optical system 5 is guided to the beam profiler 7. By the above-described configuration, it is possible to measure the beam profile of the laser beam L at the focal point thereof.

Other Embodiments

Next, as other embodiments, a method for manufacturing a semiconductor device by using the laser irradiation apparatus described in the first, second, or third embodiment, and such a semiconductor device are described with reference to FIGS. 13 and 14.

(Method for Manufacturing Semiconductor Device)

Firstly, a method for manufacturing a semiconductor device by using the above-described laser irradiation apparatus is described. In this embodiment, by using the laser annealing apparatus as a laser irradiation apparatus, it is possible to crystallize an amorphous film formed on a substrate by applying a laser beam to the amorphous film. For example, the semiconductor device is a semiconductor device including TFTs (Thin Film Transistors). In this case, it is possible to form a polysilicon film by applying a laser beam to an amorphous silicon film and thereby crystallizing the amorphous silicon film. The polysilicon film constitutes the TFTs.

Figure 13:
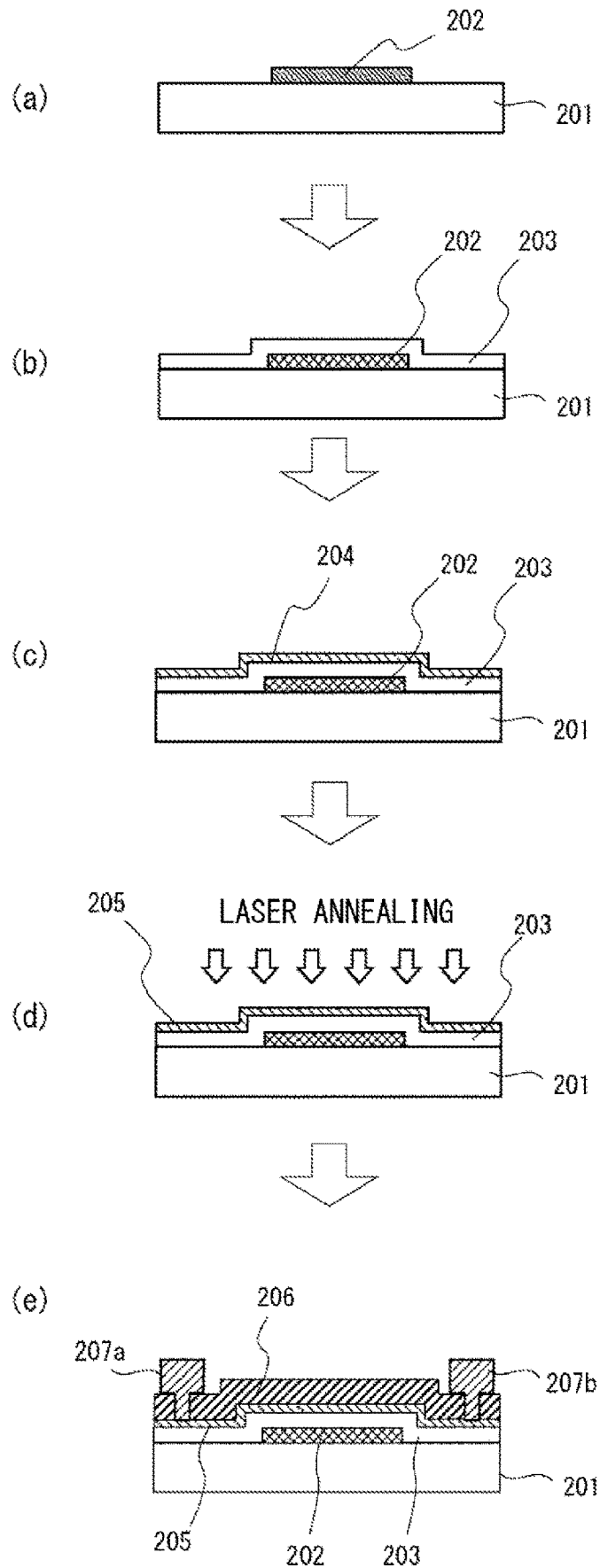
FIG. 13 shows cross sections showing processes in a method for manufacturing a semiconductor device.
Figure 14:
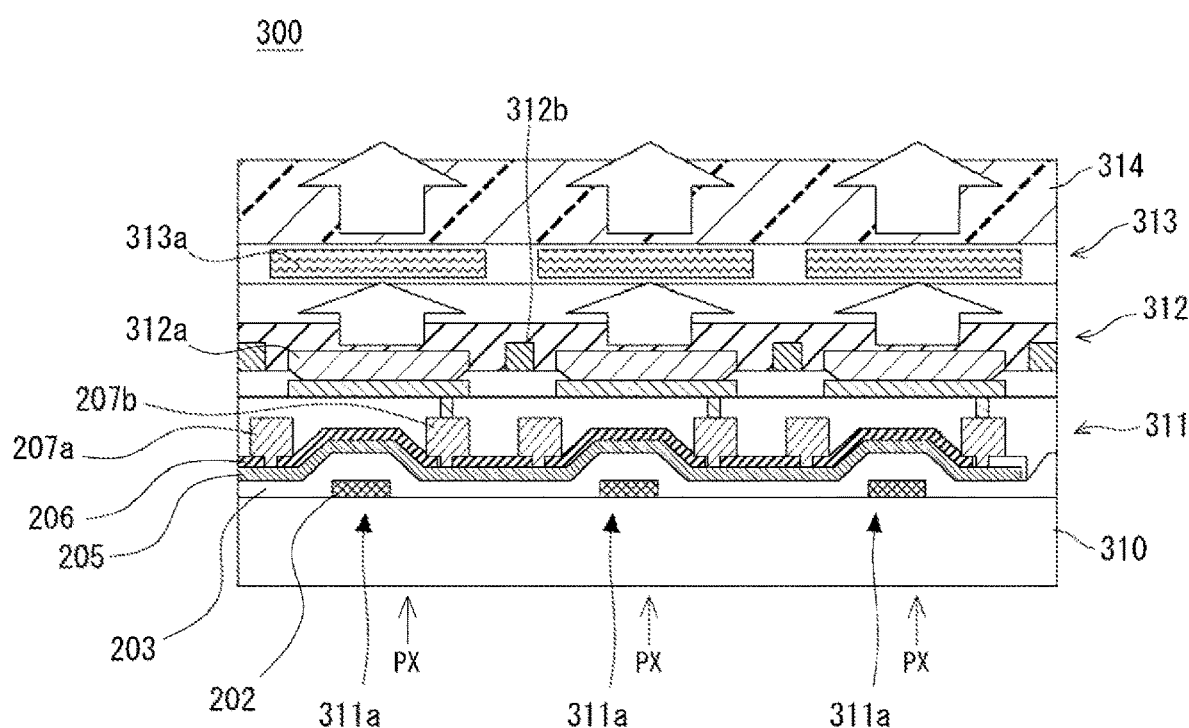
FIG. 14 is a cross section showing a configuration of an organic EL display device in a simplified manner.

FIG. 13 is a cross section for explaining an example of a method for manufacturing a semiconductor device. The laser irradiation apparatus according to the above-described embodiment is suitable for manufacturing a TFT array substrate. A method for manufacturing a semiconductor device including a TFT is described hereinafter.

Firstly, as shown in FIG. 13(a), a gate electrode 202 is formed on a glass substrate 201. For example, a metal thin film containing aluminum or the like can be used for the gate electrode 202. Next, as shown in FIG. 13(b), a gate insulating film 203 is formed on the gate electrode 202. The gate insulating film 203 is formed so as to cover the gate electrode 202. After that, as shown in FIG. 13(c), an amorphous silicon film 204 is formed on the gate insulating film 203. The amorphous silicon film 204 is disposed so as to be placed over the gate electrode 202 with the gate insulating film 203 interposed therebetween.

The gate insulating film 203 is, for example, a silicon nitride film ($SiN_x$), a silicon oxide film ($SiO_2$ film), or a laminated film thereof. Specifically, the gate insulating film 203 and the amorphous silicon film 204 are successively formed by a CVD (Chemical Vapor Deposition) method.

Then, as shown in FIG. 13(d), a polysilicon film 205 is formed by applying a laser beam to the amorphous silicon film 204 by using the above-described laser irradiation apparatus and thereby crystallizing the amorphous silicon film 204. As a result, the polysilicon film 205 in which silicon is crystallized is formed on the gate insulating film 203.

After that, as shown in FIG. 13(e), an inter-layer insulating film 206, a source electrode 207a, and a drain electrode 207b are formed on the polysilicon film 205. The inter-layer insulating film 206, the source electrode 207a, and the drain electrode 207b can be formed by an ordinary photolithography method or an ordinary film forming method.

It is possible to manufacture a semiconductor device including TFTs by using the above-described method for manufacturing a semiconductor device. Note that the subsequent manufacturing process will vary depending on the device that is eventually manufactured, and therefore its description is omitted.

(Organic EL Display)

Next, as an example of a device using a semiconductor device including TFTs, an organic EL display device is described. FIG. 14 is a cross section for explaining an outline of an organic EL display device, in which pixel circuits of the organic EL display device are illustrated in a simplified manner. The organic EL display device 300 shown in FIG. 14 is an active-matrix-type display device in which a TFT is disposed in each pixel PX.

The organic EL display device 300 includes a substrate 310, a TFT layer 311, an organic layer 312, a color filter layer 313, and a sealing substrate 314. FIG. 14 shows a top-emission-type organic EL display device, in which the side of the sealing substrate 314 is located on the viewing side. Note that the following description is given to show an example of a configuration of an organic EL display device and this embodiment is not limited to the below-described configuration. For example, a semiconductor device according to this embodiment may be used for a bottom-emission-type organic EL display device.

The substrate 310 is a glass substrate or a metal substrate. The TFT layer 311 is provided on the substrate 310. The TFT layer 311 includes TFTs 311a disposed in the respective pixels PX. Further, the TFT layer 311 includes wiring lines connected to the TFTs 311a, and the like. The TFTs 311a, the wirings, and the like constitute pixel circuits. Note that the TFT layer 311 corresponds to the TFT described above with reference to FIG. 13, and includes gate electrodes 202, a gate insulating film 203, a polysilicon film 205, an inter-layer insulating film 206, source electrodes 207a, and drain electrodes 207b.

The organic layer 312 is provided on the TFT layer 311. The organic layer 312 includes an organic EL light-emitting element 312a disposed in each pixel PX. The organic EL light-emitting element 312a has, for example, a laminated structure in which an anode, a hole injection layer, a hole transport layer, a light-emitting layer, an electron transport layer, an electron injection layer, and a cathode are laminated. In the case of the top emission type, the anode is a metal electrode and the cathode is a transparent conductive film made of ITO (Indium Tin Oxide) or the like. Further, in the organic layer 312, separation walls 312b for separating organic EL light-emitting elements 312a are provided between pixels PX.

The color filter layer 313 is provided on the organic layer 312. The color filter layer 313 includes color filters 313a for performing color displaying. That is, in each pixel PX, a resin layer colored in R (red), G (green), or B (blue) is provided as the color filter 313a. When white light emitted from the organic layer 312 passes through the color filters 313a, the white light is converted into light having RGB colors. Note that in the case of a three-color system in which organic EL light-emitting elements capable of emitting each color of RGB are provided in the organic layer 312, the color filter layer 313 may be unnecessary.

The sealing substrate 314 is provided on the color filter layer 313. The sealing substrate 314 is a transparent substrate such as a glass substrate and is provided to prevent deterioration of the organic EL light-emitting elements of the organic layer 312.

Electric currents flowing through the organic EL light-emitting elements 312a of the organic layer 312 are changed by display signals supplied to the pixel circuits. Therefore, it is possible to control an amount of light emitted in each pixel PX by supplying a display signal corresponding to a display image to each pixel PX. As a result, it is possible to display a desired image.

Note that it has been assumed that the above-described semiconductor device including TFTs is used to control the organic EL display device. However, instead of this purpose, the semiconductor device including TFTs may be used to control a liquid crystal display device.

The present invention made by the inventors of the present application has been explained above in a concrete manner based on embodiments. However, the present invention is not limited to the above-described embodiments, and needless to say, various modifications can be made without departing from the spirit and scope of the present invention.

This application is based upon and claims the benefit of priority from Japanese patent application No. 2016-196491, filed on Oct. 4, 2016, the disclosure of which is incorporated herein in its entirety by reference.

REFERENCE SIGNS LIST

1 LASER ANNEALING APPARATUS
2 PROCESSING CHAMBER
3 FLOATING-TYPE CONVEYING STAGE
4 LASER OSCILLATOR
5 OPTICAL SYSTEM
6 ATTACHING/DETACHING ACTUATOR
7 BEAM PROFILER
8 PROFILER ACTUATOR
9 CONTROL UNIT
10 CONVEYING SURFACE
11 CONVEYING STAGE MAIN BODY
12 DETACHABLE PART
L LASER BEAM
S OPENING
W WORKPIECE

The invention claimed is:

1. A laser irradiation apparatus comprising:
a laser oscillator configured to generate a laser beam;
a conveying stage configured to float and convey a workpiece to be irradiated with the laser beam; and
a measuring instrument configured to measure a beam profile of the laser beam, wherein
the conveying stage includes a conveying surface opposed to the workpiece, and a bottom surface on the side opposite to the conveying surface,
the measuring instrument is positioned below the bottom surface of the conveying stage,
the conveying stage includes a detachable part in a part of the conveying stage, the detachable part being configured to be detachable from the conveying stage,
an opening is formed in the conveying stage by detaching the detachable part from the conveying stage, the opening extending from the conveying surface to the bottom surface, and
the measuring instrument is configured to measure the beam profile of the laser beam through the opening.

2. The laser irradiation apparatus according to claim 1, wherein the detachable part is positioned on an optical axis of the laser beam.

3. The laser irradiation apparatus according to claim 1, wherein the measuring instrument is configured to move to a position of the opening.

4. The laser irradiation apparatus according to claim 1, wherein the measuring instrument is configured to measure the beam profile of the laser beam at a focal point thereof.

5. The laser irradiation apparatus according to claim 1, wherein the opening and the measuring instrument are positioned on an optical axis of the laser beam.

6. The laser irradiation apparatus according to claim 1, wherein
a planar shape of the laser beam is a rectangle having a long axis and a short axis, and
the measuring instrument is configured to move along the long axis.

7. The laser irradiation apparatus according to claim 1, wherein the workpiece is floated by gas ejected from the conveying stage toward the workpiece.

8. The laser irradiation apparatus according to claim 1, wherein the workpiece includes an amorphous semiconductor film, and a polycrystalline semiconductor film is formed by applying the laser beam to the amorphous semiconductor film.

9. A method for manufacturing a semiconductor device, comprising the steps of:
(a) floating and conveying a workpiece including an amorphous semiconductor film over a conveying stage;
(b) applying a laser beam to the amorphous semiconductor film and thereby forming a polycrystalline semiconductor film;
(c) removing a detachable part of the conveying stage and thereby forming an opening in a part of the conveying stage; and
(d) measuring a beam profile of the laser beam through the opening.

10. The method for manufacturing a semiconductor device according to claim 9, further comprising, between the steps (c) and (d), a step of moving a measuring instrument to a position of the opening, the measuring instrument being configured to measure the beam profile of the laser beam.

11. The method for manufacturing a semiconductor device according to claim 9, wherein the opening and a measuring instrument configured to measure the beam profile of the laser beam are positioned on an optical axis of the laser beam.

12. The method for manufacturing a semiconductor device according to claim 9, wherein in the step (a), the workpiece is floated by gas ejected from the conveying stage toward the workpiece.

13. The method for manufacturing a semiconductor device according to claim 9, wherein the workpiece includes a glass substrate.

14. The method for manufacturing a semiconductor device according to claim 9, wherein the polycrystalline semiconductor film forms a thin-film transistor.

15. The method for manufacturing a semiconductor device according to claim 14, wherein the thin-film transistor is used to control a liquid crystal display device or an organic EL display device.

16. A method for operating a laser irradiation apparatus, comprising the steps of:
(a) floating and conveying a workpiece over a conveying stage;
(b) applying a laser beam to the workpiece;
(c) removing a detachable part of the conveying stage and thereby forming an opening in a part of the conveying stage; and
(d) measuring a beam profile of the laser beam through the opening.

17. The method for operating the laser irradiation apparatus according to claim 16, further comprising, between the steps (c) and (d), a step of moving a measuring instrument to a position of the opening, the measuring instrument being configured to measure the beam profile of the laser beam.

18. The method for operating the laser irradiation apparatus according to claim 16, wherein the opening and a measuring instrument configured to measure the beam profile of the laser beam are positioned on an optical axis of the laser beam.

19. The method for operating the laser irradiation apparatus according to claim 16, wherein in the step (a), the workpiece is floated by gas ejected from the conveying stage toward the workpiece.

* * * * *